(12) United States Patent
Zhou et al.

(10) Patent No.: US 11,568,116 B2
(45) Date of Patent: Jan. 31, 2023

(54) FLIP-FLOP BASED TRUE RANDOM NUMBER GENERATOR (TRNG) STRUCTURE AND COMPILER FOR SAME

(71) Applicant: Taiwan Semiconductor Manufacturing Co., Ltd., Hsinchu (TW)

(72) Inventors: Charlie Zhou, Hsinchu (TW); Tze-Chiang Huang, Saratoga, CA (US); Jack Liu, Taipei (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 359 days.

(21) Appl. No.: 16/727,460

(22) Filed: Dec. 26, 2019

(65) Prior Publication Data

US 2020/0134249 A1    Apr. 30, 2020

Related U.S. Application Data

(63) Continuation of application No. 15/724,671, filed on Oct. 4, 2017, now Pat. No. 10,599,796.

(60) Provisional application No. 62/491,541, filed on Apr. 28, 2017.

(51) Int. Cl.
  *G06F 30/367*   (2020.01)
  *G06F 7/58*   (2006.01)

(52) U.S. Cl.
  CPC .......... *G06F 30/367* (2020.01); *G06F 7/588* (2013.01); *G06F 2207/583* (2013.01)

(58) Field of Classification Search
  USPC .......................................... 703/14
  See application file for complete search history.

(56) References Cited

U.S. PATENT DOCUMENTS

2007/0174374 A1* 7/2007 Inoha ............... G06F 7/584
                                                       708/252
2018/0314781 A1   11/2018 Zhou et al.

OTHER PUBLICATIONS

Majzoobi et al.: FPGA-based True Random Number Generation using Circuit Metastability with Adaptive Feedback Control; International Workshop on Cryptographic Hardware and Embedde3d Systems CHES 2011: Cryptographic Hardware and Embedded Systems—CHES 2011 pp. 17-32; 2011. (Year: 2011).

* cited by examiner

*Primary Examiner* — Bryce M Aisaka
(74) *Attorney, Agent, or Firm* — Sterne, Kessler, Goldstein & Fox P.L.L.C.

(57) ABSTRACT

A true random metastable flip-flop (TRMFF) compiler generates an electrical architecture for a TRMFF chain. The compiler selects components for the TRMFF chain from a library of standard cells and logically connects these components in accordance with a primitive polynomial to generate the electrical architecture. The TRMFF chain provides a sequence of random numbers from one or more physical processes in accordance with the primitive polynomial. During operation, one or more microscopic phenomena inside and/or outside of the TRMFF chain can cause one or more low-level, statistically random entropy noise signals to be present within the TRMFF chain. The TRMFF chain advantageously utilizes the one or more low-level, statistically random entropy noise signals to provide the sequence of random numbers.

20 Claims, 10 Drawing Sheets

FLIP-FLOP BASED TRUE RANDOM NUMBER GENERATOR (TRNG) STRUCTURE AND COMPILER FOR SAME

CROSS-REFERENCE TO RELATED APPLICATIONS

The present application is a continuation of U.S. patent application Ser. No. 15/724,671, filed Oct. 4, 2017, now U.S. Pat. No. 10,599,796, which claims the benefit of U.S. Provisional Patent Appl. No. 62/491,541, filed Apr. 28, 2017, each of which is incorporated herein by reference in its entirety.

BACKGROUND

The Internet of Things (IoT) represents an ever-growing inter-network of physical devices, vehicles, buildings, and/or other items that are embedded with electronics, software, sensors, actuators, and network connectivity which enable these devices, vehicles, buildings, and/or other items to exchange data. Concerns have been raised that the IoT is being developed rapidly without appropriate consideration of the security challenges involved. As the IoT increases in popularity, cyberattacks are likely to become an increasingly physical threat. For example, many Internet-connected appliances, such as including televisions, kitchen appliances, cameras, and/or thermostats to provide some examples, can gather information about consumers in their own homes. Computer-controlled devices in automobiles, such as brakes, engine, locks, hood and truck releases, horn, heat, and/or dashboard to provide some examples, have also been shown to be vulnerable to cyber-attacks. To address these concerns, these devices, vehicles, buildings, and/or other items often include Random Number Generators (RNGs) to provide cipher keys and to initialize vectors and other random numbers used in cryptographic operations. Unfortunately, these devices, vehicles, buildings, and/or other items are vulnerable to cyberattacks when weak RNGs are used.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is does not in itself dictate a relationship between the various embodiments and/or configurations discussed.

Overview

A true random metastable flip-flop (TRMFF) compiler generates an electrical architecture for a TRMFF chain. The TRMFF compiler selects components for the TRMFF chain from a library of standard cells and logically connects these components in accordance with a primitive polynomial to generate the electrical architecture. The TRMFF chain provides a sequence of random numbers from one or more physical processes in accordance with the primitive polynomial. During operation, one or more microscopic phenomena inside and/or outside of the TRMFF chain can cause one or more low-level, statistically random entropy noise signals to be present within the TRMFF chain. The TRMFF chain advantageously utilizes the one or more low-level, statistically random entropy noise signals to provide the sequence of random numbers.

Exemplary True Random Metastable Flip-Flop

Figure 1A:
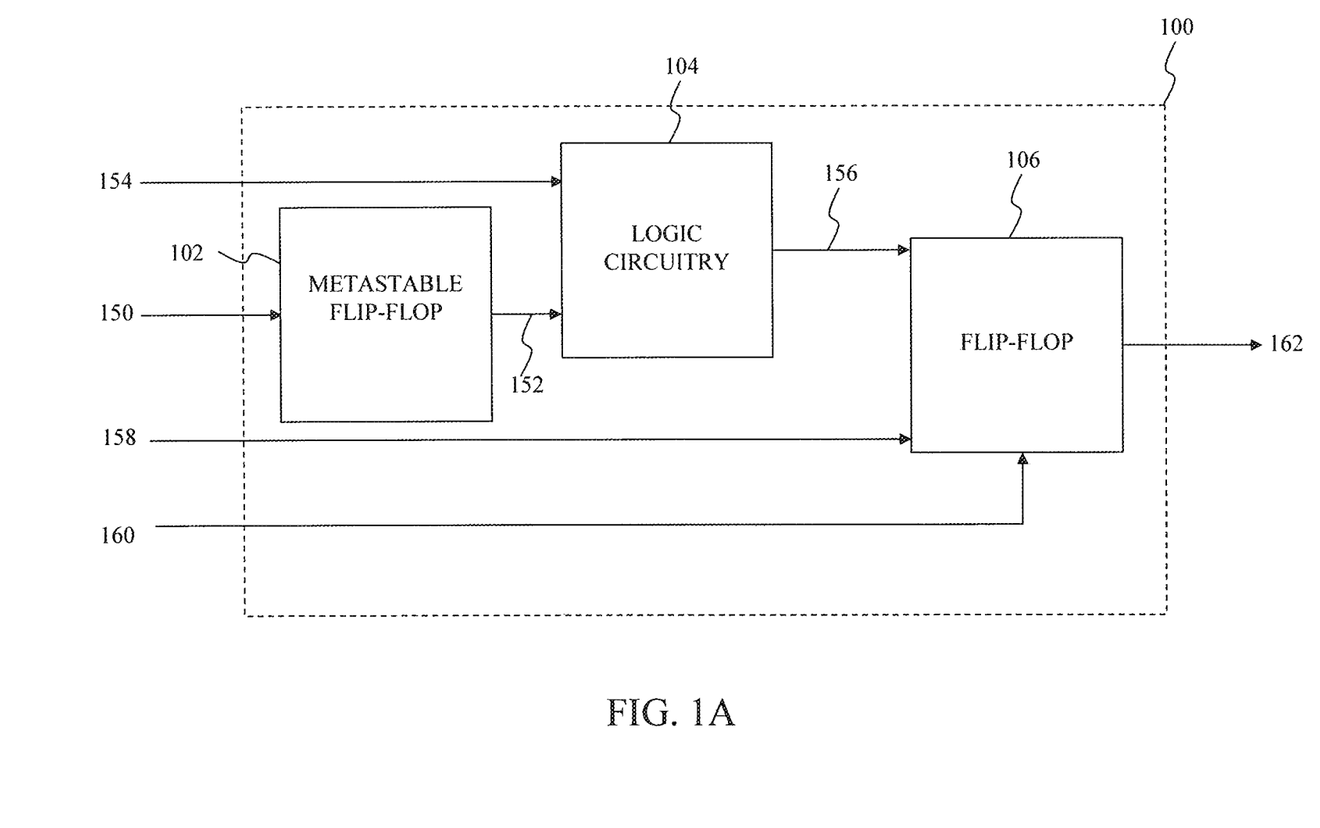
FIG. 1A illustrates a block diagram of an exemplary true random metastable flip-flop (TRMFF) according to an exemplary embodiment of the present disclosure.

FIG. 1A illustrates a block diagram of an exemplary true random metastable flip-flop (TRMFF) according to an exemplary embodiment of the present disclosure. A TRMFF 100 represents an electrical circuit that provides a sequence of random numbers. Herein, "true" indicates the sequence of random numbers is provided from one or more physical processes. During operation, one or more microscopic phenomena inside and/or outside of the TRMFF 100 can cause one or more low-level, statistically random entropy noise signals to be present within the TRMFF 100. The TRMFF 100 advantageously utilizes the one or more low-level, statistically random entropy noise signals to provide the sequence of random numbers. As illustrated in FIG. 1A, the TRMFF 100 includes a metastable flip-flop 102, logic circuitry 104, and a flip-flop 106.

The metastable flip-flop 102 receives a metastable flip-flop enable signal 150 having a first logical value, such as a logical zero to provide an example, or a second logical value, such as a logical one to provide an example. The metastable flip-flop enable signal 150 resets the metastable flip-flop 102 when the metastable flip-flop enable signal 150 is at the first logical value. Otherwise, the metastable flip-flop 102 provides a random output bit 152 when the metastable flip-flop enable signal 150 is at the second logical value. When the metastable flip-flop enable signal 150 is at the second logical value, the metastable flip-flop 102 senses one or more low-level, statistically random entropy noise signals corresponding to the one or more microscopic phenomena inside and/or outside of the TRMFF 100. The one or more microscopic phenomena inside of the TRMFF 100 can include shot noise, flicker noise, burst noise, transit noise, and/or any other statistically random microscopic phenomenon present inside of the TRMFF 100 that will be apparent to those skilled in the relevant art(s) without departing from the spirit and scope of the present disclosure, to be present within the TRMFF 100. The one or more microscopic phenomena outside of the TRMFF 100 can include intermodulation noise, crosstalk, interference, atmospheric noise, industrial noise, extraterrestrial noise and/or any other statistically random microscopic phenomenon present outside of the TRMFF 100 that will be apparent to those skilled in the relevant art(s) without departing from the spirit and scope of the present disclosure, to be present within the TRMFF 100. The metastable flip-flop 102 provides the random output bit 152 in response to the one or more low-level, statistically random entropy noise signals. The randomness of the one or more low-level, statistically random entropy noise signals can cause the metastable flip-flop 102 to equally provide the random output bit 152 at the logical one and at the logical zero to provide a strong Random Number Generator (RNG). In other words, the number of the logical ones and the logical zeros of the output bit 152 are, on average, approximately equal over a given duration of time.

In an exemplary embodiment, the metastable flip-flop 102 includes one or more digital flip-flops or latches that operate in a restricted combination or a forbidden state, also referred to as a metastable state. For example, the one or more digital flip-flops or latches can be implemented using one or more set-reset (SR) latches. While operating in the metastable state, the one or more low-level, statistically random entropy noise signals cause the restricted combination of bits to fluctuate. In this example, the one or more digital flip-flops or latches provide a random output signal at the first logical value or the second logical value depending upon which one of the restricted combination of bits first approaches the logical zero or the logical one.

The logic circuitry 104 performs one or more logical operations on the random output bit 152 in accordance with a digital seed signal 154 to provide a random output sequence of bits 156. The logic circuitry 104 can include one or more logical AND gates, one or more logical OR gates, one or more logical XOR gates, one or more logical NOT gates, one or more logical NAND gates, one or more logical NOR gates, one or more logical XNOR gates, and/or any other suitable logical gates that will be apparent to those skilled in the relevant art(s) without departing from the spirit and scope of the present disclosure. In an exemplary embodiment, the logic circuitry 104 is implemented using a logical XNOR gate to perform a logical exclusive—or function between the random output bit 152 and the digital seed signal 154 to provide the random output sequence of bits 156. In the exemplary embodiment illustrated in FIG. 1A, the digital seed signal 154 represents a random, pseudo-random, or non-random sequence of bits.

The flip-flop 106 resamples or re-times the random output sequence of bits 156 in accordance with a clocking signal 158 to provide a random output sequence of bits 162. The flip-flop 106 can be implemented using a data or delay (D) flip-flop, a T flip-flop, a JK flip-flop, or any other suitable flip-flop or latch that will be apparent to those skilled in the relevant art(s) without departing from the spirit and scope of the present disclosure. In some situations, the specific implementation chosen for the flip-flop 106, such as the D flip-flop to provide an example, may use multiple inputs for proper operation of the flip-flop 106. In these situations, a metastable prevention signal 160 can be set to the first logical value or the second logical value to preclude the flip-flop 106 from operating in the metastable state. For example, the metastable prevention signal 160 can be set to the logical one to preclude the flip-flop 106, when implemented using the D flip-flop, from operating in the metastable state.

Figure 1B:
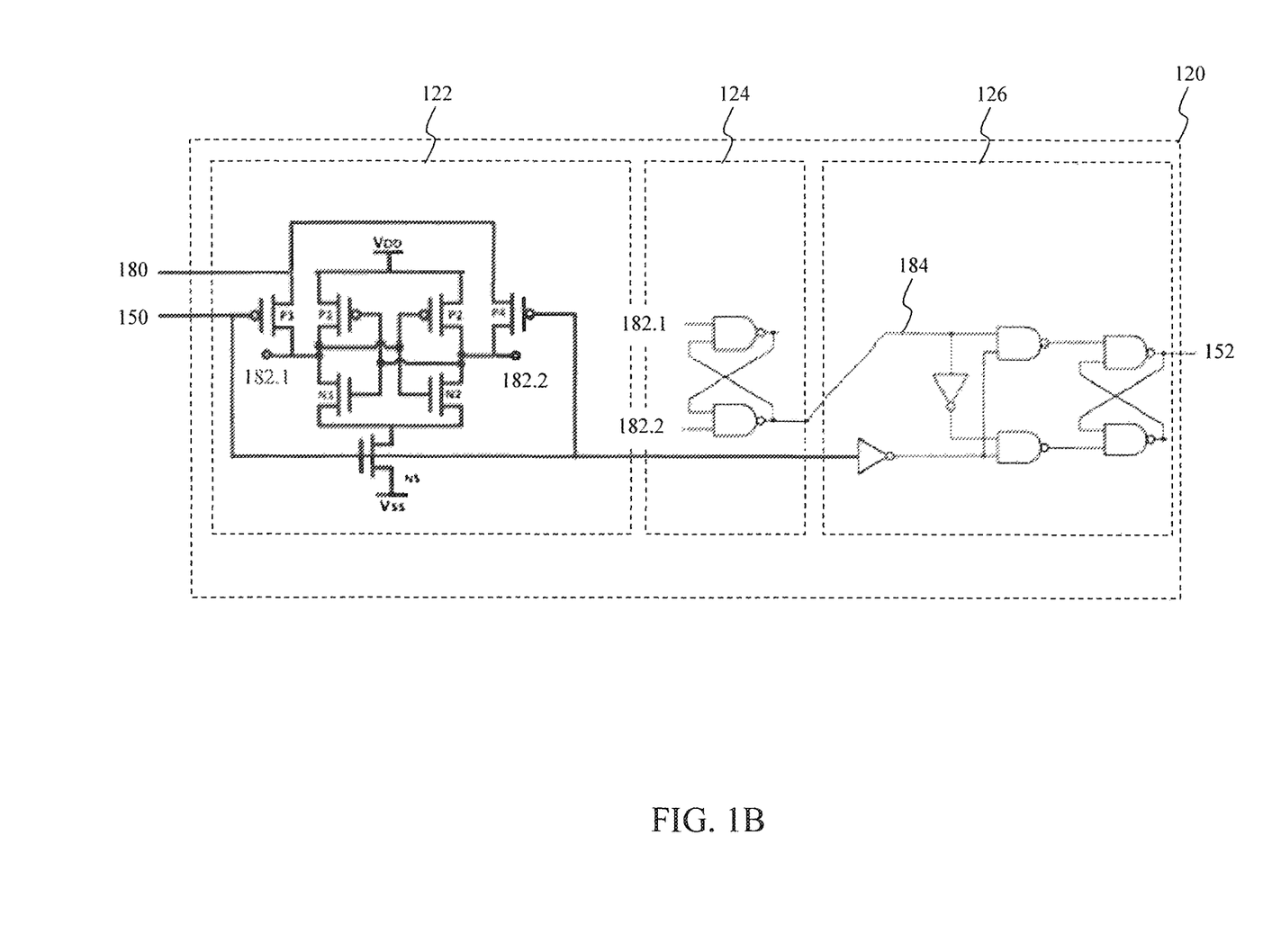
FIG. 1B illustrates a block diagram of an exemplary metastable flip-flop (MFF) according to an exemplary embodiment of the present disclosure.

FIG. 1B illustrates a block diagram of an exemplary metastable flip-flop (MFF) according to an exemplary embodiment of the present disclosure. A metastable flip-flop 120 senses one or more low-level, statistically random entropy noise signals 182.1 and 182.2 corresponding to the one or more microscopic phenomena to provides the random output bit 152 in response to the one or more low-level, statistically random entropy noise signals. As illustrated in FIG. 1B, the metastable flip-flop 120 includes a sense-amplifier based latch 122, a set-reset (SR) latch 124, and a data (D) flip-flop 126. The metastable flip-flop 120 can represent an exemplary embodiment of the metastable flip-flop 102.

The sense-amplifier based latch 122 receives the metastable flip-flop enable signal 150 having the first logical value or the second logical value. The sense-amplifier based latch 122 senses one or more low-level, statistically random entropy noise signals 182.1 and 182.2 corresponding to the one or more microscopic phenomena when the metastable flip-flop enable signal 150 is at the first logical value, such as the logical zero to provide an example. In some embodiments, the one or more low-level, statistically random entropy noise signals 182.1 and 182.2 are statistically random. However, in some situations, the one or more low-level, statistically random entropy noise signals may not be statistically random, causing the random output bit 152 to exhibit a bias toward the logical one, namely more logical ones on average over a given duration of time than logical zeros, or toward the logical zero, namely more logical zeros on average over a given duration of time than logical ones. In these situations, the sense-amplifier based latch 122 can compensate for this biasing of the random output bit 152 to increase the randomness, and hence, security, of the random output bit 152. As illustrated in FIG. 1B, the sense-amplifier based latch 122 includes p-channel metal-oxide semiconductor (PMOS) transistors P1 through P4 and n-channel metal-oxide semiconductor (NMOS) transistors N1, N2, and NS. In the exemplary embodiment as illustrated in FIG. 1B, the PMOS transistors P1 through P4 and the NMOS transistors N1, N2, and NS are arranged to form a differential difference amplifier. In the exemplary embodiment as illustrated in FIG. 1B, the sense-amplifier based latch 122 receives a biasing voltage 180 to compensate for this bias. The biasing voltage 180 can be increased from a first value to a second value to adjust the biasing of the random output bit 152 toward the logical zero, namely increase the number of logical zeros and decrease the number of logical ones on average over a given duration of time. The biasing voltage 180 can be decreased from a first value to a second value to adjust the biasing of the random output bit 152 toward the logical one, namely increase the number of logical ones and decrease the number of logical zeros on average over a given duration of time. Otherwise, in the exemplary embodiment as illustrated in FIG. 1B, the NMOS transistors N1, N2 can be trimmed to adjust this bias. For example, the dimensions of the NMOS transistors N1, N2 can be increased to adjust the biasing of the random output bit 152 toward the logical zero, namely increase the number of logical zeros and decrease the number of logical ones on average over a given duration of time and or decreased to adjust the biasing of the random output bit 152 toward the logical one, namely increase the number of logical ones and decrease the number of logical zeros on average over a given duration of time.

The SR latch 124 equalizes a load present on the one or more low-level, statistically random entropy noise signals 182.1 and 182.2. In the exemplary embodiment as illustrated in FIG. 1B, the one or more low-level, statistically random entropy noise signals 182.1 and 182.2 settle at opposite logical values when the metastable flip-flop enable signal 150 is at the first logical value. Thereafter, the SR latch 124 provides a random output signal 184 at the first logical value, such as the logical zero, when the low-level, statistically random entropy noise signal 182.1 is at the first logical value, such as the logical zero and the low-level, statistically random entropy noise signal 182.2 is at the second logical value, such as the logical one. Otherwise, the SR latch 124 provides a random output signal 184 at the second logical value when the low-level, statistically random entropy noise signal 182.1 is at the second logical value and the low-level, statistically random entropy noise signal 182.2 is at the first logical value. Also in the exemplary embodiment as illustrated in FIG. 1B, the one or more low-level, statistically random entropy noise signals 182.1 and 182.2 are at the second logical value, such as the logical one, when the metastable flip-flop enable signal 150 is at the second logical value. In this situation, the SR latch 124 holds the previous value of the random output signal 184 as the random output signal 184.

The D flip-flop 126 stores the random output signal 184 to provide the random output bit 152. The metastable flip-flop enable signal 150 holds the value of the random output bit 152 when the metastable flip-flop enable signal 150 is at the second logical value, such as the logical one. Otherwise, the metastable flip-flop 102 stores the random output signal 184 to provide the random output bit 152 when the metastable flip-flop enable signal 150 is at the first logical value, such as the logical zero.

Figure 1C:
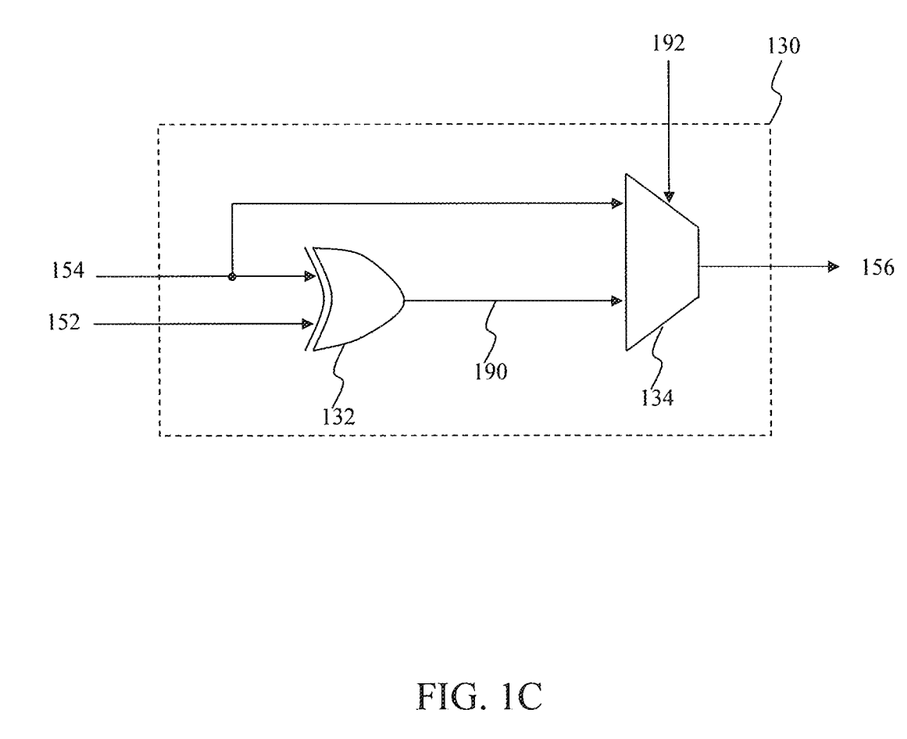
FIG. 1C illustrates a block diagram of exemplary logic circuitry according to an exemplary embodiment of the present disclosure.

FIG. 1C illustrates a block diagram of exemplary logic circuitry according to an exemplary embodiment of the present disclosure. As illustrated in FIG. 1C, logic circuitry 130 performs one or more logical operations on the random output bit 152 in accordance with the digital seed signal 154 to provide the random output sequence of bits 156. As illustrated in FIG. 1C, the logic circuitry 130 includes a logical exclusive—or (XOR) gate 132 and multiplexing circuitry 134. The logic circuitry 130 can represent an exemplary embodiment of the logic circuitry 104.

The XOR gate 132 performs a logical exclusive—or function between the random output bit 152 and the digital seed signal 154 to provide a random output sequence of bits 190.

The multiplexing circuitry 134 selects the digital seed signal 154 or the random output sequence of bits 190 to be the random output sequence of bits 156 in response to an operation mode indicator 192. When the operation mode indicator 192 is at a first logical value, such as a logical zero to provide an example, the multiplexing circuitry 134 selects the digital seed signal 154 as the random output sequence of bits 156. In this mode of operation, the logic circuitry 130 is characterized as operating in a "pseudo" mode of operation. In this "pseudo" mode of operation, the random output sequence of bits 156 is characterized as being based on an electronically generated sequence of bits.

Otherwise, the multiplexing circuitry 134 selects the random output sequence of bits 190 as the random output sequence of bits 156 when the operation mode indicator 192 is at a second logical value, such as a logical one to provide an example. In this mode of operation, the logic circuitry 130 is characterized as operating in a "true" mode of operation. In this "true" mode of operation, the random output sequence of bits 156 is characterized as being based on one or more physical processes, such as the one or more microscopic phenomena as discussed above.

Exemplary Complementary True Random Metastable Flip-Flop

Figure 2:
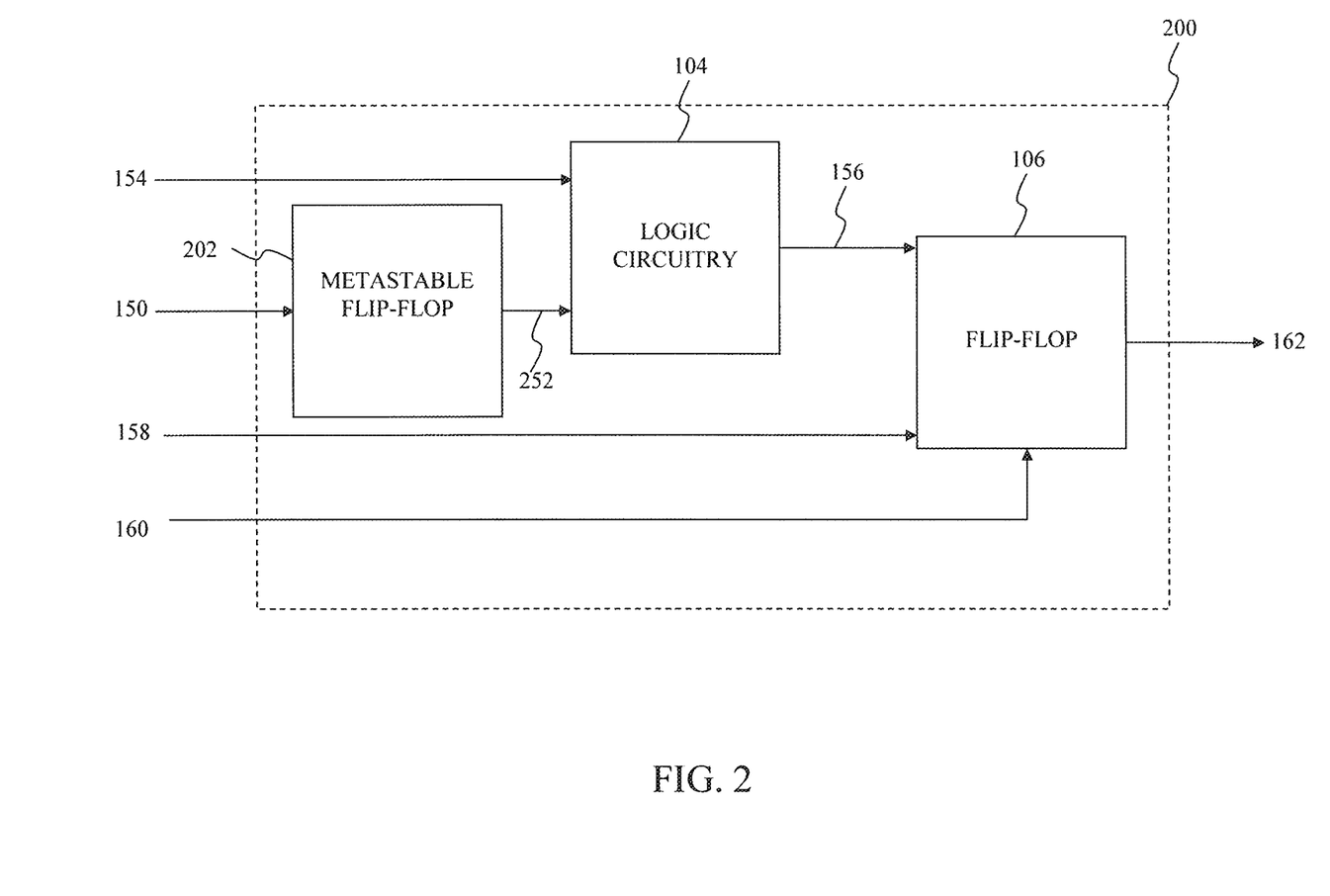
FIG. 2 illustrates a block diagram of an exemplary complementary true random metastable flip-flop (TRMFF) according to an exemplary embodiment of the present disclosure.

FIG. 2 illustrates a block diagram of an exemplary complementary true random metastable flip-flop ($\overline{\text{TRMFF}}$) according to an exemplary embodiment of the present disclosure. A $\overline{\text{TRMFF}}$ 200 represents a complement of the TRMFF 100 as described above in FIG. 1A. As such, the $\overline{\text{TRMFF}}$ 200 operates in a substantially similar manner as the TRMFF 100 as described above in FIG. 1A; therefore, only differences between the TRMFF 100 and the $\overline{\text{TRMFF}}$ 200 are to be discussed in further detail below. As illustrated in FIG. 2, the $\overline{\text{TRMFF}}$ 200 includes the logic circuitry 104, the flip-flop 106, and a metastable flip-flop 202. The metastable flip-flop 202 operates in a substantially similar manner as the metastable flip-flop 102 as discussed above in FIG. 1A to provide a random output bit 252 which represents a complement of the random output bit 152. As such, the random output sequence of bits 162 provided by the $\overline{\text{TRMFF}}$ 200 represents a complement of the random output sequence of bits 162 provided by the TRMFF 100.

Exemplary True Random Metastable Flip-Flop (TRMFF) Chains

Figure 3:
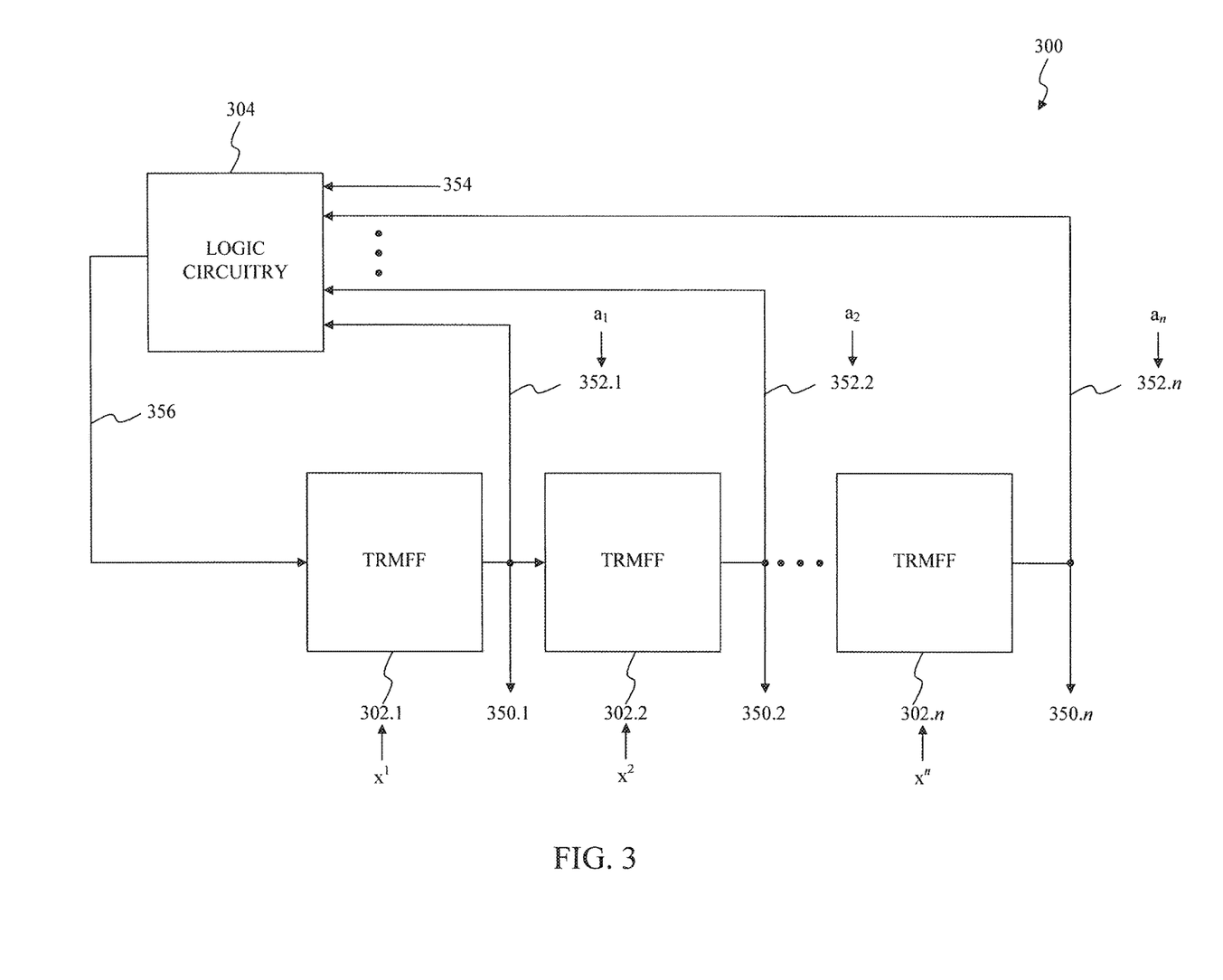
FIG. 3 illustrates a block diagram of an exemplary true random metastable flip-flop (TRMFF) chain according to an exemplary embodiment of the present disclosure.

FIG. 3 illustrates a block diagram of an exemplary true random metastable flip-flop (TRMFF) chain according to an exemplary embodiment of the present disclosure. A TRMFF chain 300 represents an electrical circuit that provides an n-bit sequence of random numbers 350.1 through 350.n in accordance with a primitive polynomial denoted as:

$$a_n x^n + \ldots + a_2 x^2 + a_1 x^1 + 1, \tag{1}$$

where $a_n$ through $a_1$ represent coefficients of the primitive polynomial and n represents degrees of freedom, or simply degrees, of the primitive polynomial. The coefficients $a_n$ through $a_1$ of the primitive polynomial can be assigned to a one or a zero depending upon the implementation of the primitive polynomial. As illustrated in FIG. 3, the TRMFF chain 300 includes TRMFFs 302.1 through 302.n and logic circuitry 304.

The TRMFFs 302.1 through 302.n represent a sequence of serially coupled true random metastable flip-flops, such as the TRMFF 100 as described above in FIG. 1A and/or the $\overline{\text{TRMFF}}$ 200 as described above in FIG. 2 to provide some examples, for providing the n-bit sequence of random numbers 350.1 through 350.n. In an exemplary embodiment, the TRMFFs 302.1 through 302.n can be implemented using the TRMFF 100 and/or the $\overline{\text{TRMFF}}$ 200. In this exemplary embodiment, the metastable flip-flop enable signals 150 for the TRMFF 100 or the $\overline{\text{TRMFF}}$ 200 are coupled to each other, the clocking signals 158 for the TRMFF 100 or the $\overline{\text{TRMFF}}$ 200 are coupled to each other, and the metastable prevention signal 160 for the TRMFF 100 or the $\overline{\text{TRMFF}}$ 200 are coupled to each other. Moreover, in this exemplary embodiment, the random output sequence of bits 162 corresponding to a first TRMFF 302, such as the TRMFF 302.1 as shown in FIG. 3 to provide an example, is coupled to the digital seed signal 154 corresponding to a second TRMFF 302, such as the TRMFF 302.2 as shown in FIG. 3 to provide an example.

In another exemplary embodiment, the TRMFFs 302.1 through 302.$n$ can be implemented using only the TRMFF 100 or only the $\overline{\text{TRMFF}}$ 200 as described above in FIG. 2. In some situations, the n-bit sequence of random numbers 350.1 through 350.$n$ provided by this implementation can include a non-random bias toward the one or the zero. For example, a statistical sampling of the n-bit sequence of random numbers 350.1 through 350.$n$ when the TRMFFs 302.1 through 302.$n$ are implemented using the TRMFF 100 over a period of time can indicate the n-bit sequence of random numbers 350.1 through 350.$n$ includes, on average, more logical ones than logical zeros. In this example, the n-bit sequence of random numbers 350.1 through 350.$n$ is characterized as having the non-random bias toward the logical one when the TRMFFs 302.1 through 302.$n$ are implemented using the TRMFF 100. As another example, the statistical sampling of the n-bit sequence of random numbers 350.1 through 350.$n$ when the TRMFFs 302.1 through 302.$n$ are implemented using the $\overline{\text{TRMFF}}$ 200 over the period of time can indicate the n-bit sequence of random numbers 350.1 through 350.$n$ includes, on average, more logical zeros than logical ones. In this example, the n-bit sequence of random numbers 350.1 through 350.$n$ is characterized as having the non-random bias toward the logical zero when the TRMFFs 302.1 through 302.$n$ are implemented using the $\overline{\text{TRMFF}}$ 200.

In these situations, the TRMFFs 302.1 through 302.$n$ can be implemented using a suitable combination of the TRMFF 100 and the $\overline{\text{TRMFF}}$ 200 to compensate for the non-random biasing that can be present within the TRMFFs 302.1 through 302.$n$ when the TRMFFs 302.1 through 302.$n$ are implemented using the TRMFF 100 or the $\overline{\text{TRMFF}}$ 200. Alternatively, or in addition to, in these situations, the TRMFF 100 and the $\overline{\text{TRMFF}}$ 200 can include one or more adjustable biasing voltages to adjust their operation to compensate for the non-random biasing that can be present within the TRMFFs 302.1 through 302.$n$ when the TRMFFs 302.1 through 302.$n$ are implemented using the TRMFF 100 or the $\overline{\text{TRMFF}}$ 200. These one or more adjustable biasing voltages can be used to adjust various voltages present on various nodes of the TRMFF 100 and the $\overline{\text{TRMFF}}$ 200 to adjust the biasing of the n-bit sequence of random numbers 350.1 through 350.$n$ to be toward the logical zero when the n-bit sequence of random numbers 350.1 through 350.$n$ includes, on average, more logical ones than logical zeros or to be toward the logical one when the n-bit sequence of random numbers 350.1 through 350.$n$ includes, on average, more logical zeros than logical ones.

Figure 4A:
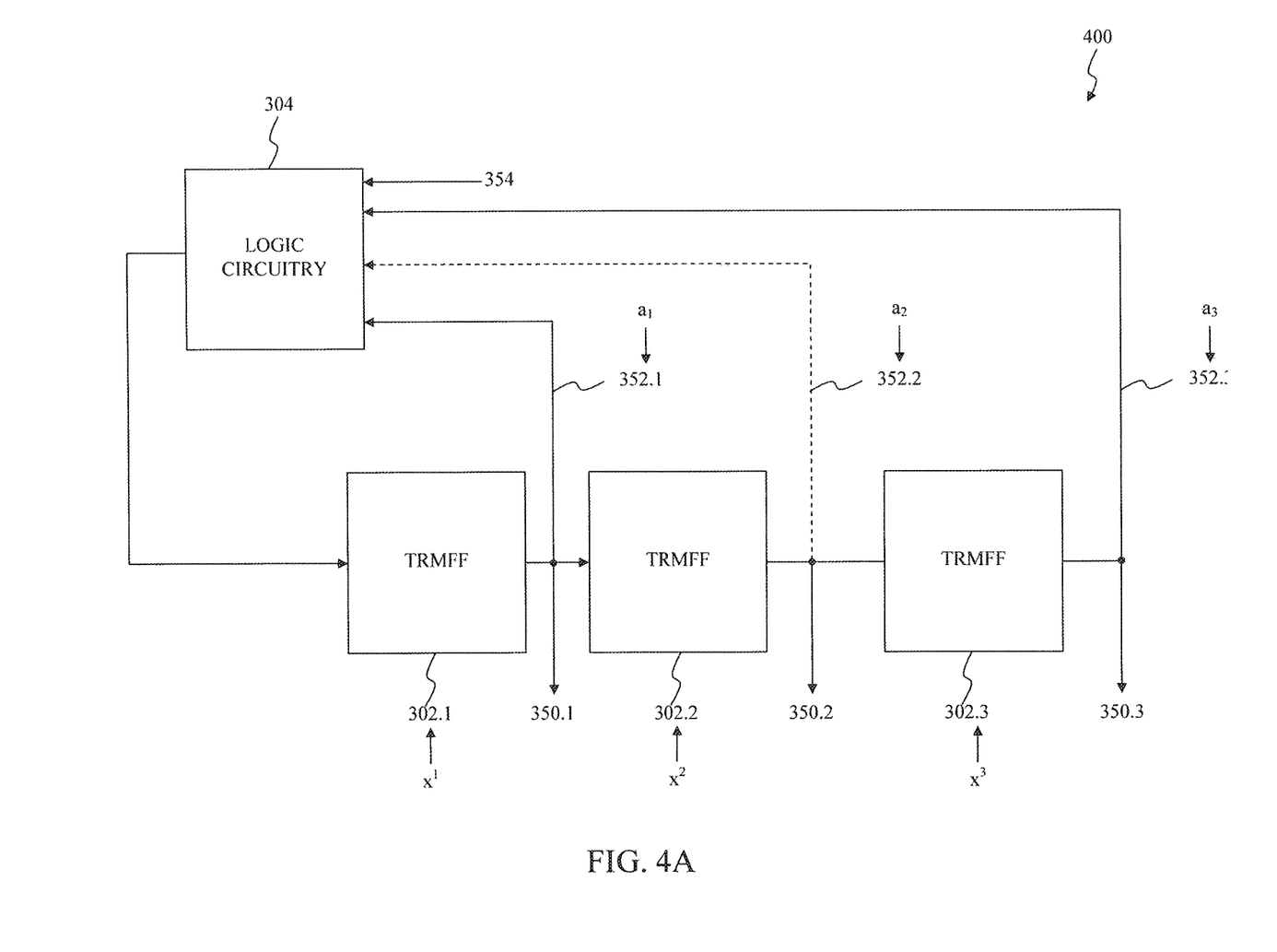
FIG. 4A illustrates a block diagram of a first exemplary implementation of the exemplary TRMFF chain according to an exemplary embodiment of the present disclosure.

As illustrated in FIG. 3, a number of TRMFF from among the TRMFFs 302.1 through 302.$n$ is dependent on the n-degrees of the primitive polynomial denoted in Equation (1). In the exemplary embodiment illustrated in FIG. 3, the TRMFFs 302.1 through 302.$n$ correspond to the primitive polynomial having n-degrees as shown in Equation (1) above with the TRMFF 302.1 representing the first degree, or least significant degree, of the primitive polynomial, namely $x^1$, and the TRMFF 302.$n$ representing the $n^{th}$ degree, or most significant degree, of the primitive polynomial, namely $x^n$. Moreover, the coefficients $a_n$ through $a_1$ of the primitive polynomial denoted in Equation (1) correspond to signal pathways 352.1 through 352.$n$ as illustrated FIG. 3. The coupling of the signal pathways 352.1 through 352.$n$ to the logic circuitry 304 is dependent on the coefficients $a_n$ through $a_1$ of the primitive polynomial being implemented and can vary for different primitive polynomials. For example, a corresponding signal pathway from among the signal pathways 352.1 through 352.$n$ is coupled to the logic circuitry 304 when its corresponding coefficient from among the coefficients $a_n$ through $a_1$ of the primitive is a one. Otherwise in this example, the corresponding signal pathway is not coupled to the logic circuitry 304 when its corresponding coefficient from among the coefficients $a_n$ through $a_1$ of the primitive is a zero. For example, FIG. 4A illustrates a block diagram of a first exemplary implementation of the exemplary TRMFF chain according to an exemplary embodiment of the present disclosure. In the exemplary embodiment illustrated in FIG. 4A, the TRMFF chain 400 represents an implementation of a primitive polynomial denoted as:

$$x^3+x^1+1, \qquad (2)$$

where the coefficients $a_1$ and $a_3$ of the primitive polynomial are ones and the coefficient $a_2$ of the primitive polynomial is a zero. As such, the signal pathways 352.1 and 352.3 corresponding to the coefficients $a_1$ and $a_3$ of the primitive polynomial are connected, denoted by the solid line in FIG. 4A, to the logic circuitry 304 and the signal pathways 352.2 corresponding to the coefficient $a_2$ of the primitive polynomial is not connected, denoted by the dashed line in FIG. 4A, to the logic circuitry 304. However, those skilled in the relevant art(s) will recognize that the coupling of the signal pathways 352.1 through 352.$n$ to the logic circuitry 304 as illustrated in FIG. 4A is for exemplary purposes only. Those skilled in the relevant art(s) will recognize that the coupling of the signal pathways 352.1 through 352.$n$ to the logic circuitry 304 is dependent on the coefficients $a_n$ through $a_1$ of the primitive polynomial being implemented and can be different than illustrated in FIG. 4A without departing from the spirit and scope of the present disclosure.

The logic circuitry 304 performs one or more logical operations on those signal pathways from among the signal pathways 352.1 through 352.$n$ that are coupled to the logic circuitry 304 and a digital input seed 354 to provide a digital output seed 356 to the TRMFFs 302.1 through 302.$n$. In the exemplary embodiment illustrated in FIG. 3, the digital seed signal 354 represents a random, pseudo-random, or non-random sequence of bits. In an exemplary embodiment, the digital output seed 356 represents an exemplary embodiment of the digital seed signal 354. The logic circuitry 304 can include one or more logical AND gates, one or more logical OR gates, one or more logical XOR gates, one or more logical NOT gates, one or more logical NAND gates, one or more logical NOR gates, one or more logical XNOR gates, and/or any other suitable logical gates that will be apparent to those skilled in the relevant art(s) without departing from the spirit and scope of the present disclosure. In an exemplary embodiment, the logic circuitry 304 is implemented using a logical XNOR gate to perform a logical exclusive—or function between those signal pathways from among the signal pathways 352.1 through 352.n that are coupled to the logic circuitry 304 and the digital input seed 354 to provide the digital output seed 356.

Figure 4B:
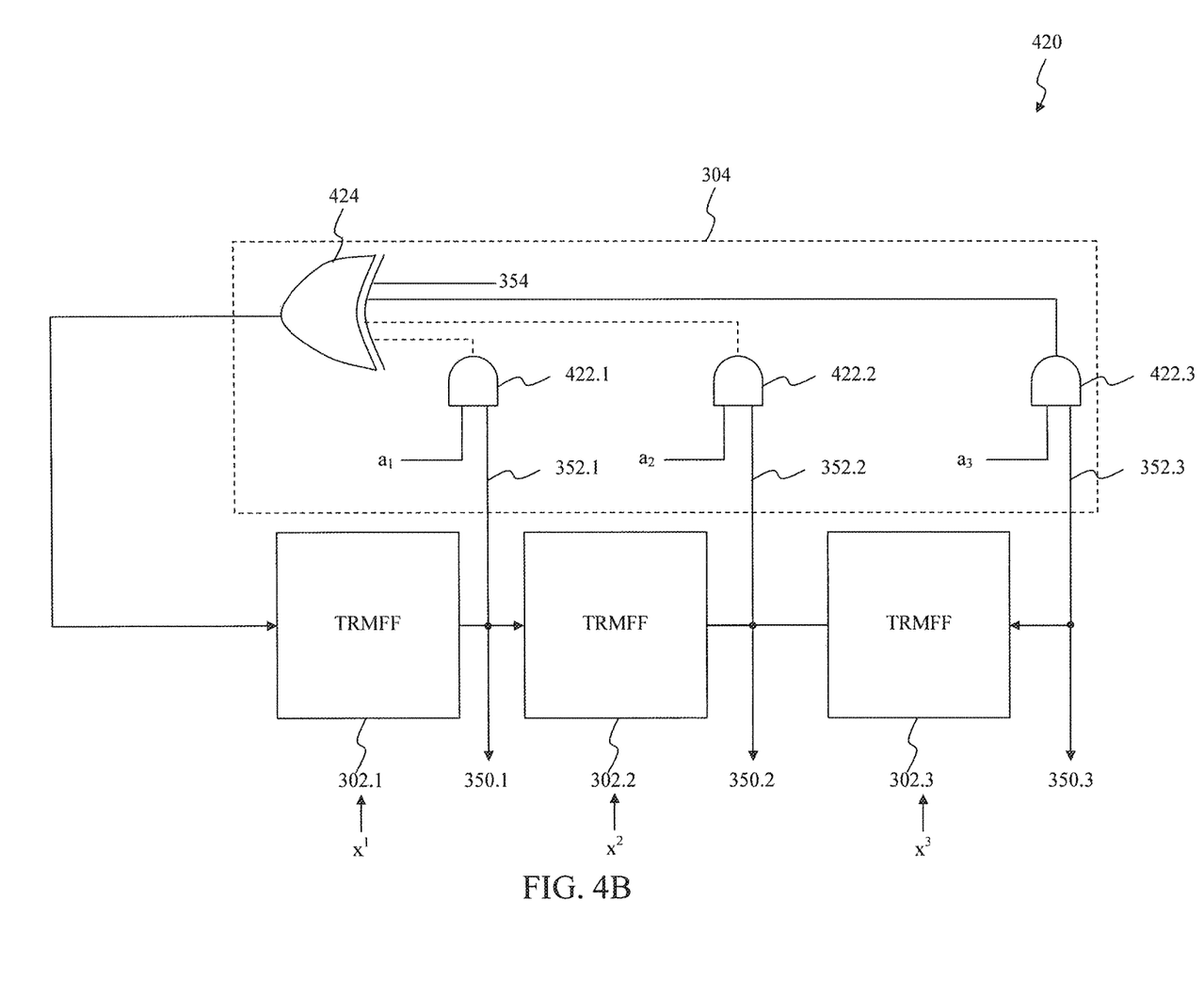
FIG. 4B illustrates a block diagram of a second exemplary implementation of the exemplary TRMFF chain according to an exemplary embodiment of the present disclosure.

As another example, FIG. 4B illustrates a block diagram of a second exemplary implementation of the exemplary TRMFF chain according to an exemplary embodiment of the present disclosure. In the exemplary embodiment illustrated in FIG. 4B, the TRMFF chain 420 chain represents an implementation of a primitive polynomial denoted as:

$$x^3+x^1+1, \tag{3}$$

where the coefficient $a_1$ and $a_3$ of the primitive polynomial are ones and the coefficient $a_2$ of the primitive polynomial is a zero. In the exemplary embodiment illustrated in FIG. 4B, the logic circuitry 304 includes logical NAND gates 422.1 through 422.3 and a logical XOR gate 424. In an exemplary embodiment, the coefficients $a_1$ through $a_3$ of the primitive polynomial can be stored in a memory, such as a one-time programmable (OTP) memory, a programmable read only memory (PROM), dynamic random-access memory (DRAM), static random-access memory (SRAM), and/or non-volatile random-access memory (NVRAM), such as flash memory to provide an example. As illustrated in FIG. 4B, the logical NAND gate 422.3, corresponding to the coefficient $a_3$, provides a logical one, denoted by the solid line in FIG. 4B, when the signal pathway 352.3 corresponding to the coefficient $a_3$ of the primitive polynomial is also the logical one and the logical NAND gates 422.1 and 422.2, corresponding to the coefficients $a_1$ and $a_z$, respectively, provides a logical zero, denoted by the dashed line in FIG. 4B, irrespective of the logical values present on the signal pathways 352.1 and 352.2, respectively. corresponding to the coefficient $a_3$ of the primitive polynomial is also the logical one. However, those skilled in the relevant art(s) will recognize that the exemplary operation of the switching circuitry 422 as illustrated in FIG. 4B is for exemplary purposes only. Those skilled in the relevant art(s) will recognize that the operation of the switching circuitry 422 is dependent on the coefficients $a_n$ through $a_1$ of the primitive polynomial being implemented and can be different than illustrated in FIG. 4B without departing from the spirit and scope of the present disclosure.

Referring back to FIG. 3, the logic circuitry 304 performs one or more logical operations on those signal pathways from among the signal pathways 352.1 through 352.n that are coupled to the logic circuitry 304 and a digital input seed 354 to provide a digital output seed 356 to the TRMFFs 302.1 through 302.n. In the exemplary embodiment illustrated in FIG. 3, the digital seed signal 354 represents a random, pseudo-random, or non-random sequence of bits. In an exemplary embodiment, the digital output seed 356 represents an exemplary embodiment of the digital seed signal 154. The logic circuitry 304 can include one or more logical AND gates, one or more logical OR gates, one or more logical XOR gates, one or more logical NOT gates, one or more logical NAND gates, one or more logical NOR gates, one or more logical XNOR gates, and/or any other suitable logical gates that will be apparent to those skilled in the relevant art(s) without departing from the spirit and scope of the present disclosure. In an exemplary embodiment, the logic circuitry 304 is implemented using a logical XNOR gate to perform a logical exclusive—or function between those signal pathways from among the signal pathways 352.1 through 352.n that are coupled to the logic circuitry 304 and the digital input seed 354 to provide the digital output seed 356.

Figure 5:
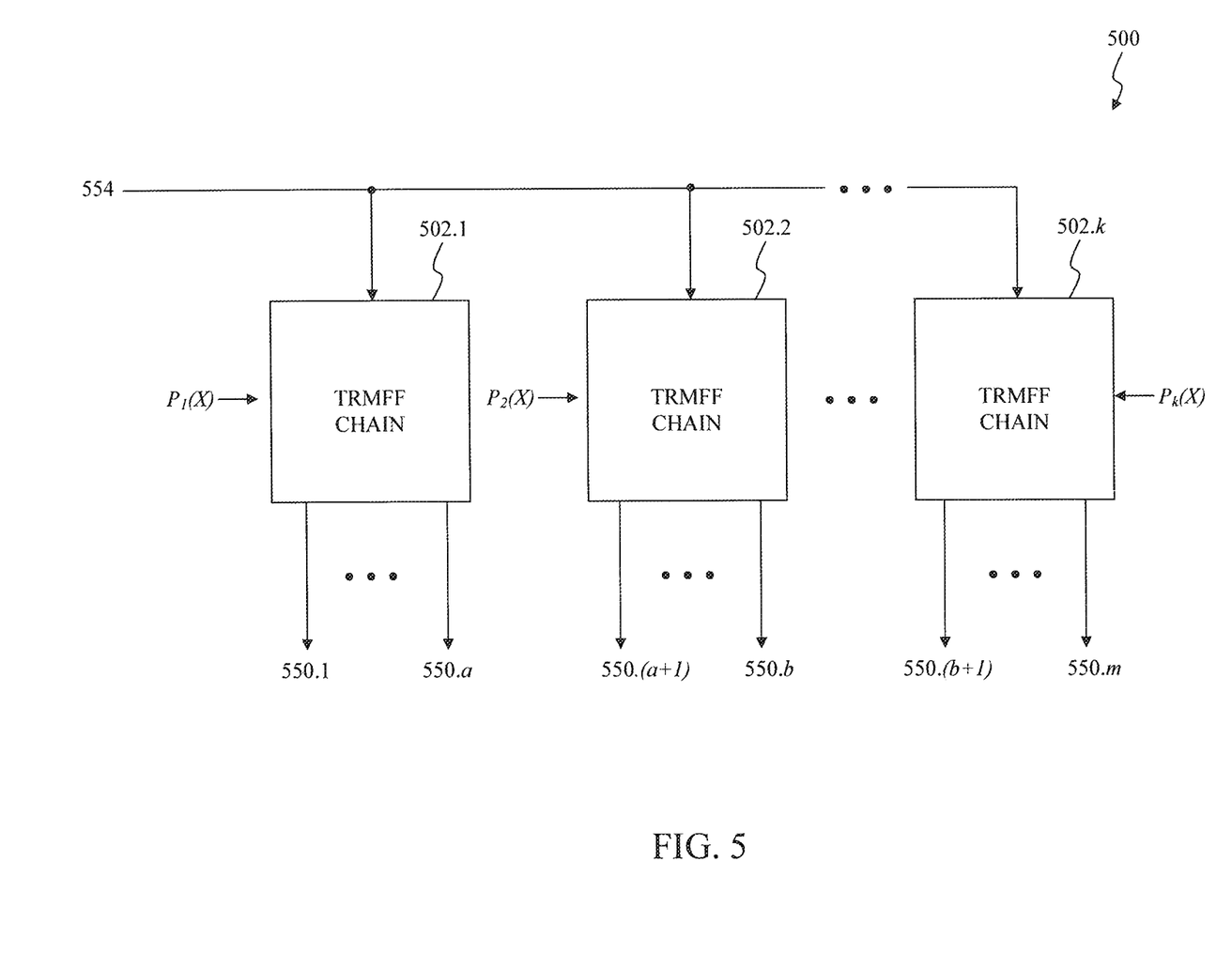
FIG. 5 illustrates a block diagram of a second exemplary true random metastable flip-flop (TRMFF) chain according to an exemplary embodiment of the present disclosure.

FIG. 5 illustrates a block diagram of a second exemplary true random metastable flip-flop (TRMFF) chain according to an exemplary embodiment of the present disclosure. A TRMFF chain 500 represents an electrical circuit that provides a sequence of random numbers 550.1 through 550.m in accordance with primitive polynomials $P_1(X)$ through $P_k(X)$. As discussed above in FIG. 3, the TRMFF chain 300 provides the n-bit sequence of random numbers 350.1 through 350.n. In the exemplary embodiment illustrated in FIG. 5, the TRMFF chain 500 can cascade multiple TRMFF chains to provide an m-bit sequence of random numbers 550.1 through 550.m that is greater than the n-bit sequence of random numbers 350.1 through 350.n. This exemplary embodiment cascades multiple lesser degree primitive polynomials, such as multiple ones of the primitive polynomial having n-degrees as denoted in Equation (1) to provide an example, to provide a greater degree polynomial. As shown in FIG. 5, the TRMFF chain 500 includes TRMFF chains 502.1 through 502.k.

As illustrated in FIG. 5, the TRMFF chains 502.1 through 502.k provide the m-bit sequence of random numbers 550.1 through 550.m in accordance with the primitive polynomials $P_1(X)$ through $P_k(X)$ in response to a digital input seed 554 representing a random, pseudo-random, or non-random sequence of bits. In an exemplary embodiment, each of the primitive polynomials $P_1(X)$ through $P_k(X)$ can be similar primitive polynomials or different primitive polynomials. As such, the TRMFF chains 502.1 through 502.k can include a similar or a different number of TRMFFs 302.1 through 302.n. Referring to FIG. 5, the TRMFF chain 502.1 provides an a-bit sequence of random numbers 550.1 through 550.a in accordance with the primitive polynomial $P_1M$. In this exemplary embodiment, the TRMFF chain 502.2 provides a b-bit sequence of random numbers 550.(a+1) through 552.b in accordance with the primitive polynomial $P_2(X)$. Also in this exemplary embodiment, the TRMFF chain 502.k provides an $m^{th}$ n-bit sequence of random numbers 550.(b+1) through 550.m in accordance with the primitive polynomial $P_k(X)$.

Exemplary True Random Metastable Flip-Flop (TRMFF) Chain Compiler

Figure 6:
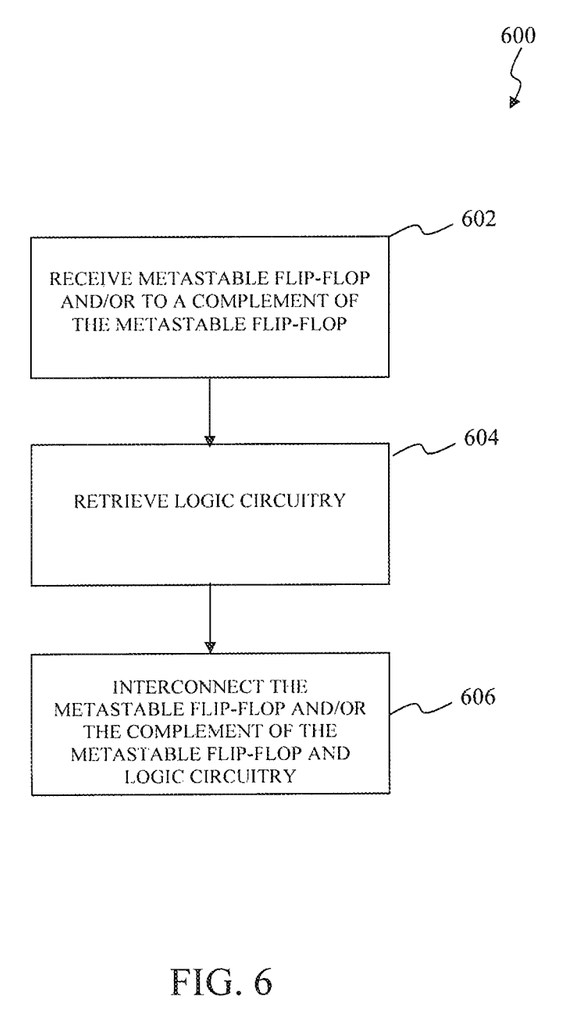
FIG. 6 illustrates a flowchart of an exemplary operation of an exemplary true random metastable flip-flop (TRMFF) compiler according to an exemplary embodiment of the present disclosure.

FIG. 6 illustrates a flowchart of an exemplary operation of an exemplary true random metastable flip-flop (TRMFF) compiler according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes an exemplary TRMFF compiler 600, when executed by a computer system, generates a TRMFF chain, such as the TRMFF chain 300 and/or the TRMFF chain 500 to provide an example, in accordance with a primitive polynomial. In an exemplary embodiment, the exemplary TRMFF compiler 600 can be implemented in hardware, firmware, software, or any combination thereof. As another example, the exemplary TRMFF compiler 600 can be implemented as instructions stored on a machine-readable medium, which may be read and executed by one or more processors. Herein, a machine-readable medium may include any mechanism for storing or transmitting information in a form readable by one or more computing devices, processors, controllers, or other devices that will be apparent to those skilled in the relevant art(s) without departing from the spirit and scope of the present disclosure. A machine-readable medium can include a read only memory (ROM), a random access memory (RAM), a magnetic disk storage medium, a solid state storage medium, an optical storage media, and/or a flash memory device to provide some examples. However, it should be appreciated that such descriptions are merely for convenience and that such actions in fact result from computing devices, processors, controllers, or other devices that will be apparent to those skilled in the relevant art(s) executing the firmware, software, routines, and/or instructions. In another exemplary embodiment, the exemplary TRMFF compiler 600 can be characterized as achieving a balance between power requirements, performance requirements, and real-estate requirements for a given security requirement for IoT devices.

At operation 602, the exemplary TRMFF compiler 600 receives one or more standard cells corresponding to a metastable flip-flop, such as the metastable flip-flop 102 to provide an example, and/or to a complement of the metastable flip-flop, such as the metastable flip-flop 202 to provide an example, from a library of standard cells. In an exemplary embodiment, the library of standard cells can represent one or more software models of analog circuits and/or digital circuits in a high-level software language, such as a graphical design tool, for example C, C++, LabVIEW, and/or MATLAB, a general purpose system design language, such as like SysML, SMDL and/or SSDL, or any other suitable high-level software language that will be apparent to those skilled in the relevant art(s) without departing from the spirit and scope of the present disclosure. In an exemplary embodiment, the exemplary TRMFF compiler 600 implements the TRMFF chain using an equivalent number of the one or more standard cells corresponding to the metastable flip-flop and one or more standard cells corresponding to the complement of the metastable flip-flop to compensate for non-random biasing that can be present in the TRMFF chain as described above in FIG. 3. In another exemplary embodiment, the exemplary TRMFF compiler 600 implements the TRMFF chain using a different number of the one or more standard cells corresponding to the metastable flip-flop and one or more standard cells corresponding to the complement of the metastable flip-flop to compensate for non-random biasing that can be present in the TRMFF chain when the equivalent number of the one or more standard cells results in the non-random biasing.

At operation 604, the exemplary TRMFF compiler 600 receives one or more standard cells corresponding to logic circuitry, such as the logic circuitry 304 to provide an example, from the library of standard cells.

At operation 606, the exemplary TRMFF compiler 600 interconnects the one or more standard cells from operation 602 corresponding to the metastable flip-flop and/or the complement of the metastable flip-flop and the one or more standard cells from operation 604 corresponding to the logic circuitry in accordance with a primitive polynomial, such as the primitive polynomial denoted in Equation (1) to provide an example, as discussed above in FIG. 3 through FIG. 5 to generate an software model for the TRMFF chain. In an exemplary embodiment, this software model is generated by the high-level software language at a register-transfer level (RTL). In an exemplary embodiment, the software model can be imported to the library of standard cells. In a manner similar as discussed above in FIG. 3 through FIG. 5, the exemplary TRMFF compiler 600 logically couples the one or more standard cells from operation 602 corresponding to the metastable flip-flop and/or the complement of the metastable flip-flop to generate a metastable flip-flop chain. Thereafter, the exemplary TRMFF compiler 600 logically couples various signal pathways, such as the signal pathways 352.1 through 352.*n* to provide an example, of the one or more standard cells from operation 602 corresponding to the metastable flip-flop and/or the complement of the metastable flip-flop to the one or more standard cells from operation 604 corresponding to the logic circuitry in accordance with coefficients of the primitive polynomial, such as the coefficients $a_n$ through $a_1$ of the primitive polynomial denoted in Equation (1) to provide an example, to generate the TRMFF chain. In an exemplary embodiment, the high-level software language logically connects the various signal pathways of the one or more standard cells from operation 602 corresponding to the metastable flip-flop and/or the complement of the metastable flip-flop to the one or more standard cells from operation 604. In some situations, the exemplary TRMFF compiler 600 can be iteratively repeat operation 606 to generate multiple TRMFF chains based upon a length of a sequence of random numbers to be provided by the TRMFF chain.

Exemplary Computer System for Executing the Exemplary TRMFF Chain Compiler

Figure 7:
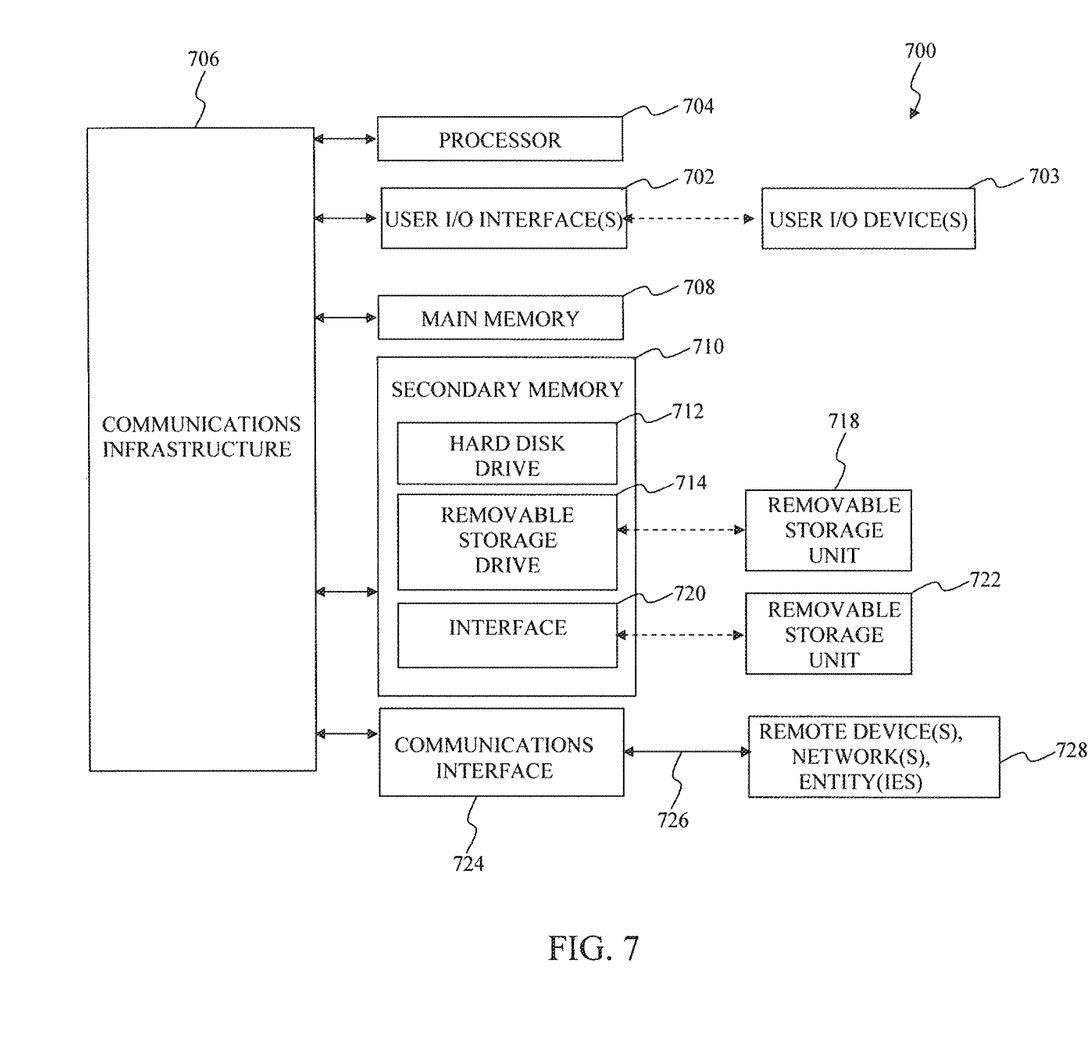
FIG. 7 illustrates a block diagram of an exemplary computer system for executing the exemplary TRMFF chain compiler according to an exemplary embodiment of the present disclosure.

FIG. 7 illustrates a block diagram of an exemplary computer system 700 for executing the exemplary TRMFF chain compiler according to an exemplary embodiment of the present disclosure. A computer system 700 can be used to execute the exemplary TRMFF compiler 600. After reading this description, it will become apparent to a person skilled in the relevant art how to implement embodiments using other computer systems and/or computer architectures.

The computer system 700 includes one or more processors 704, also referred to as central processing units, or CPUs, to execute the exemplary TRMFF compiler 600 described above in FIG. 6. The one or more processors 704 can be connected to a communication infrastructure or bus 706. In an exemplary embodiment, one or more of the one or more processors 704 can be implemented as a graphics processing unit (GPU). The GPU represents a specialized electronic circuit designed to rapidly process mathematically intensive applications on electronic devices. The GPU may have a highly parallel structure that is efficient for parallel processing of large blocks of data, such as mathematically intensive data common to computer graphics applications, images and videos.

The computer system 700 also includes user input/output device(s) 703, such as monitors, keyboards, pointing devices, etc., which communicate with communication infrastructure 706 through user input/output interface(s) 702.

The computer system 700 also includes a main or primary memory 708, such as a random access memory (RAM) to provide an example. The main memory 708 can include one or more levels of cache. The main memory 708 has stored therein control logic (i.e., computer software) and/or data, such as the exemplary TRMFF compiler 600 described above in FIG. 6.

The computer system 700 can also include one or more secondary storage devices or memory 710 to store the exemplary TRMFF compiler 600 described above in FIG. 6. The one or more secondary storage devices or memory 710 can include, for example, a hard disk drive 712 and/or a removable storage device or drive 714. The removable storage drive 714 may be a floppy disk drive, a magnetic tape drive, a compact disk drive, an optical storage device, tape backup device, and/or any other storage device/drive. The removable storage drive 714 may interact with a removable storage unit 718. The removable storage unit 718 includes a computer usable or readable storage device having stored thereon computer software (control logic) and/or data. The removable storage unit 718 may be a floppy disk, magnetic tape, compact disk, DVD, optical storage disk, and/any other computer data storage device. The removable storage drive 714 reads from and/or writes to removable storage unit 718 in a well-known manner.

According to an exemplary embodiment, the one or more secondary storage devices or memory 710 may include other means, instrumentalities or other approaches for allowing computer programs and/or other instructions and/or data to be accessed by computer system 700. Such means, instrumentalities or other approaches may include, for example, a removable storage unit 722 and an interface 720. Examples of the removable storage unit 722 and the interface 720 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

The computer system 700 may further include a communication or network interface 724. The communication or network interface 724 enables the computer system 700 to communicate and interact with any combination of remote devices, remote networks, remote entities, etc. (individually and collectively referenced by reference number 728). For example, the communication or network interface 724 may allow the computer system 700 to communicate with the remote devices 728 over a communications path 726, which may be wired and/or wireless, and which may include any combination of LANs, WANs, the Internet, etc. Control logic and/or data may be transmitted to and from the computer system 700 via communication path 726.

In an embodiment, a tangible apparatus or article of manufacture comprising a tangible computer useable or readable medium having control logic (software) stored thereon is also referred to herein as a computer program product or program storage device. This includes, but is not limited to, the computer system 700, the main memory 708, the secondary memory 710, and the removable storage units 718 and 722, as well as tangible articles of manufacture embodying any combination of the foregoing. Such control logic, when executed by one or more data processing devices (such as computer system 700), causes such data processing devices to operate as described herein.

Based on the teachings contained in this disclosure, it will be apparent to persons skilled in the relevant art(s) how to make and use the invention using data processing devices, computer systems and/or computer architectures other than that shown in FIG. 7. In particular, embodiments may operate with software, hardware, and/or operating system implementations other than those described herein.

CONCLUSION

The foregoing Detailed Description discloses a computer system for generating a model of a true random metastable flip-flop (TRMFF) chain. The computer system includes a memory and a processor. The memory stores a TRMFF compiler. The processor executes the TRMFF compiler, the TRMFF compiler, when executed by the processor causes the processor to: receive one or more first standard cells corresponding to a metastable flip-flop and one or more second standard cells corresponding to a complement of the metastable flip-flop, receive one or more third standard cells corresponding to logic circuitry, and interconnect the one or more first standard cells, the one or more second standard cells, and the one or more third standard cells in accordance with a predefined primitive polynomial to generate a model of the TRMFF chain.

The foregoing Detailed Description also discloses a true random metastable flip-flop (TRMFF) chain. The TRMFF chain includes multiple TRMFFs and first logic circuitry. The multiple TRMFFs provide multiple random numbers in accordance with multiple degrees of a polynomial, each TRMFF from among the multiple TRMFFs corresponding to a degree from among the multiple degrees and a coefficient from among multiple coefficients of the polynomial. The first logic circuitry performs one or more logical operations on a digital input seed and random numbers from among the multiple random numbers corresponding to TRMFFs from among the TRMFFs whose coefficients from among the multiple coefficients are ones to provide a digital output seed to the multiple TRMFFs.

The foregoing Detailed Description further discloses a true random metastable flip-flop (TRMFF) chain. The TRMFF chain including multiple of TRMFF chains to provide multiple of random numbers in accordance multiple of polynomials. Each TRMFF chain from among the multiple TRMFF includes multiple of TRMFFs and first logic circuitry. The multiple TRMFFs provides a corresponding set of random numbers from among the multiple random numbers in accordance with multiple of degrees of a corresponding polynomial from among the multiple polynomials, each TRMFF from among the multiple TRMFFs corresponding to a degree from among the multiple degrees and a coefficient from among multiple of coefficients of the corresponding polynomial. The first logic circuitry performs one or more logical operations on a digital input seed and random numbers from among the corresponding set of random numbers corresponding to TRMFFs from among the TRMFFs whose coefficients from among the multiple coefficients are ones to provide a digital output seed to the multiple TRMFFs.

The foregoing Detailed Description outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A flip-flop chain, comprising:
a plurality of flip-flops configured to provide a plurality of logical numbers in accordance with a plurality of degrees of a polynomial, each flip-flop from among the plurality of flip-flops corresponding to a degree from among the plurality of degrees and a coefficient from among a plurality of coefficients of the polynomial,
wherein at least one flip-flop from among the plurality of flip-flops comprises:
first flip-flop circuitry configured to sense one or more statistically random entropy noise signals corresponding to one or more microscopic phenomena to provide a first output bit,
first logic circuitry configured to perform one or more first logical operations on the first output bit in accordance with a digital seed signal to provide a first output sequence of bits, and second flip-flop circuitry configured to re-time the first output sequence of bits in accordance with a clocking signal to provide at least one logical number from among the plurality of logical numbers; and second logic circuitry configured to perform one or more second logical operations on a digital input and logical numbers from among the plurality of logical numbers corresponding to flip-flops from among the plurality of flip-flops whose coefficients from among the plurality of coefficients are ones to provide a digital output to the plurality of flip-flops.

2. The flip-flop chain of claim 1, wherein the first flip-flop circuitry is configured to adjust a bias of the first output bit to be, on average, a similar number of logical ones and logical zeros over a given duration of time.

3. The flip-flop chain of claim 1, wherein the at least one flip-flop corresponds to a least significant degree from among the plurality of degrees of the polynomial.

4. The flip-flop chain of claim 1, wherein at least one other flip-flop from among the plurality of flip-flops comprises:

third flip-flop circuitry configured to sense the one or more statistically random entropy noise signals corresponding to the one or more microscopic phenomena to provide a second output bit;

third logic circuitry configured to perform the one or more first logical operations on the second output bit in accordance with the digital seed signal to provide a second output sequence of bits; and fourth flip-flop circuitry configured to re-time the second output sequence of bits in accordance with the clocking signal to provide at least one other logical number from among the plurality of logical numbers.

5. The flip-flop chain of claim 4, wherein the at least one flip-flop is a complement of the at least one other flip-flop.

6. The flip-flop chain of claim 4, wherein the at least one other flip-flop corresponds to a most significant degree from among the plurality of degrees of the polynomial.

7. The flip-flop chain of claim 1, wherein a number of flip-flops of the plurality of flip-flops corresponds to a number of degrees of the plurality of degrees of the polynomial.

8. The flip-flop chain of claim 1, wherein the second logic circuitry is further configured to not perform the one or more second logical operations on logical numbers from among the plurality of logical numbers corresponding to flip-flops from among the plurality of flip-flops whose coefficients from among the plurality of coefficients are zeros.

9. A flip-flop chain, comprising:

a plurality of chains configured to provide a plurality of logical numbers in accordance with a plurality of polynomials, each chain from among the plurality of chains comprising:

a plurality of flip-flops configured to provide a corresponding set of logical numbers from among the plurality of logical numbers in accordance with a plurality of degrees of a corresponding polynomial from among the plurality of polynomials, each flip-flop from among the plurality of flip-flops corresponding to a degree from among the plurality of degrees and a coefficient from among a plurality of coefficients of the corresponding polynomial, wherein at least one flip-flop from among the plurality of flip-flops comprises:

first flip-flop circuitry configured to sense one or more statistically random entropy noise signals corresponding to one or more microscopic phenomena to provide a first output bit, first logic circuitry configured to perform one or more first logical operations on the first output bit in accordance with a digital seed signal to provide a first output sequence of bits, and second flip-flop circuitry configured to re-time the first output sequence of bits in accordance with a clocking signal to provide a first number from among the plurality of logical numbers, and second logic circuitry configured to perform one or more second logical operations on a digital input and logical numbers from among the corresponding set of logical numbers corresponding to flip-flops from among the plurality of flip-flops whose coefficients from among the plurality of coefficients are ones to provide a digital output to the plurality of flip-flops.

10. The flip-flop chain of claim 9, wherein the plurality of polynomials are similar polynomials.

11. The flip-flop chain of claim 9, wherein at least one other flip-flop from among the plurality of flip-flops comprises:

third flip-flop circuitry configured to sense the one or more statistically random entropy noise signals corresponding to the one or more microscopic phenomena to provide a second output bit;

third logic circuitry configured to perform the one or more first logical operations on the second output bit in accordance with the digital seed signal to provide a second output sequence of bits; and fourth flip-flop circuitry configured to re-time the second output sequence of bits in accordance with the clocking signal to provide at least one other logical number from among the plurality of logical numbers.

12. The flip-flop chain of claim 11, wherein the at least one flip-flop corresponds to a least significant degree from among the plurality of degrees of the polynomial, and wherein the at least one other flip-flop corresponds to a most significant degree from among the plurality of degrees of the polynomial.

13. The flip-flop chain of claim 9, wherein the first logic circuitry is further configured to not perform the one or more second logical operations on logical numbers from among the plurality of logical numbers corresponding to flip-flops from among the plurality of flip-flops whose coefficients from among the plurality of coefficients are zeros.

14. A flip-flop chain, comprising:

a plurality of flip-flops configured to provide a plurality of logical numbers in accordance with a plurality of degrees of a polynomial, each flip-flop from among the plurality of flip-flops corresponding to a degree from among the plurality of degrees and a coefficient from among a plurality of coefficients of the polynomial, wherein at least one flip-flop from among the plurality of flip-flops is a complement of at least one other flip-flop from among the plurality of flip-flops; and first logic circuitry configured to perform one or more first logical operations on logical numbers from among the plurality of logical numbers corresponding to flip-flops from among the plurality of flip-flops whose coefficients from among the plurality of coefficients are ones.

15. The flip-flop chain of claim 14, wherein the at least one flip-flop comprises:

first flip-flop circuitry configured to sense one or more statistically entropy random noise signals corresponding to one or more microscopic phenomena to provide a first output bit;

second logic circuitry configured to perform one or more second logical operations on the first output bit in accordance with a digital seed signal to provide a first output sequence of bits; and second flip-flop circuitry configured to re-time the first output sequence of bits in accordance with a clocking signal to provide at least one logical number from among the plurality of logical numbers.

16. The flip-flop chain of claim 15, wherein the first flip-flop circuitry is configured to adjust a bias of the first output bit to be, on average, a similar number of logical ones and logical zeros over a given duration of time.

17. The flip-flop chain of claim 15, wherein the at least one flip-flop corresponds to a least significant degree from among the plurality of degrees of the polynomial.

18. The flip-flop chain of claim 14, wherein a number of flip-flops of the plurality of flip-flops corresponds to a number of degrees of the plurality of degrees of the polynomial.

19. The flip-flop chain of claim 14, wherein the first logic circuitry is further configured to not perform the one or more first logical operations on logical numbers from among the plurality of logical numbers corresponding to flip-flops from among the plurality of flip-flops whose coefficients from among the plurality of coefficients are zeros.

20. The flip-flop chain of claim 14, wherein the at least one other flip-flop comprises:

third flip-flop circuitry configured to sense the one or more statistically entropy random_noise signals corresponding to the one or more microscopic phenomena to provide a second output bit;

third logic circuitry configured to perform the one or more first logical operations on the second output bit in accordance with the digital seed signal to provide a second output sequence of bits; and fourth flip-flop circuitry configured to re-time the second output sequence of bits in accordance with the clocking signal to provide at least one other logical number from among the plurality of logical numbers.

* * * * *